United States Patent
Chao et al.

(10) Patent No.: US 10,784,768 B2
(45) Date of Patent: Sep. 22, 2020

(54) CONVERSION CIRCUIT AND CONVERSION CIRCUITRY

(71) Applicant: DELTA ELECTRONICS, INC., Taoyuan (TW)

(72) Inventors: Wei-Hsiang Chao, Taoyuan (TW); Po-Chin Chuang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/528,675

(22) Filed: Aug. 1, 2019

(65) Prior Publication Data

US 2019/0356211 A1   Nov. 21, 2019

Related U.S. Application Data

(63) Continuation-in-part of application No. 16/234,598, filed on Dec. 28, 2018.

(60) Provisional application No. 62/628,692, filed on Feb. 9, 2018.

(51) Int. Cl.
    *H02M 1/08*  (2006.01)
    *H03K 17/0812*  (2006.01)
    *H03K 17/687*  (2006.01)

(52) U.S. Cl.
    CPC ........ *H02M 1/08* (2013.01); *H03K 17/08122* (2013.01); *H03K 17/6872* (2013.01); *H03K 17/6877* (2013.01)

(58) Field of Classification Search
    CPC . H03F 3/245; H03F 3/195; H03F 3/72; H03F 2200/336; H03F 2200/451; H02M 1/08; H02M 1/32; H03K 17/08122; H03K 17/6877; H03K 17/6872; H03K 17/20
    See application file for complete search history.

(56) References Cited

U.S. PATENT DOCUMENTS

| | | | |
|---|---|---|---|
| 6,628,532 B1 | 9/2003 | Rinne et al. | |
| 7,907,001 B2 | 3/2011 | Mazzola | |
| 2004/0061521 A1 | 4/2004 | Watanabe | |
| 2004/0169973 A1* | 9/2004 | Koch, II | H03K 17/08122 |
| | | | 361/90 |
| 2013/0301170 A1 | 11/2013 | Wagoner et al. | |
| 2014/0042452 A1 | 2/2014 | Pendharkar et al. | |
| 2014/0320198 A1 | 10/2014 | Eckel et al. | |
| 2016/0013636 A1 | 1/2016 | Cai et al. | |
| 2017/0359055 A1 | 12/2017 | Li | |

FOREIGN PATENT DOCUMENTS

| | | |
|---|---|---|
| CN | 104283198 A | 1/2015 |
| CN | 105009430 A | 10/2015 |
| CN | 105427793 A | 3/2016 |

(Continued)

*Primary Examiner* — Sibin Chen
(74) *Attorney, Agent, or Firm* — CKC & Partners Co., LLC

(57) ABSTRACT

A conversion circuit includes a main device including a first terminal, a second terminal and a control terminal, and a voltage control switching circuit including a first terminal configured to receive an first driving signal, a second terminal coupled to the control terminal of the main device and configured to transmit a second driving signal to drive the main device, and a reference terminal coupled to the second terminal of the main device. A current passing through the voltage control switching device is controlled in response to a voltage level of the reference terminal.

4 Claims, 10 Drawing Sheets

(56) References Cited

FOREIGN PATENT DOCUMENTS

| DE | 102014108576 A1 | 12/2015 |
| EP | 2009792 A2 | 12/2008 |
| EP | 2632046 A1 | 8/2013 |
| TW | 201526499 A | 7/2015 |
| TW | 201803271 A | 1/2018 |
| WO | 2008/155917 A1 | 12/2008 |
| WO | 2013/156811 A1 | 10/2013 |
| WO | 2017053333 A1 | 3/2017 |
| WO | 2017/199949 A1 | 11/2017 |

* cited by examiner

US 10,784,768 B2

CONVERSION CIRCUIT AND CONVERSION CIRCUITRY

RELATED APPLICATIONS

This application is a Continuation-in-part of U.S. application Ser. No. 16/234,598, filed on Dec. 28, 2018, which claims priority of U.S. Provisional Application Ser. No. 62/628,692, filed on Feb. 9, 2018, the entirety of which is incorporated by reference herein in their entireties.

BACKGROUND

Technical Field

The present disclosure relates to a power supply device, and in particular, to a conversion circuit in the power supply device.

Description of Related Art

For existing conversion circuit for the power converters, the supplying voltage is designed in response to the rated voltage of the semiconductor device to be driven. Therefore, one or more additional voltage regulators are required to regulate the system supplying power to meet the voltage requirement of the conversion circuit and the semiconductor device.

SUMMARY

One aspect of the present disclosure is a conversion circuit. The conversion circuit includes a main device, a voltage control switching circuit and a miller clamp circuit. The main device includes a first terminal, a second terminal and a control terminal. The voltage control switching circuit includes a first terminal, a second terminal and a reference terminal. The first terminal is configured to receive a first driving signal. The second terminal is coupled to the control terminal of the main device, and configured to transmit a second driving signal to drive the main device. The reference terminal is coupled to the second terminal of the main device. A voltage level of the second driving signal is generated by the voltage control switching circuit. The miller clamp circuit is electrically coupled to the control terminal of the main device and the reference terminal of the voltage control switching circuit. The miller clamp circuit is configured to receive the second driving signal. When the main device is turned off, the miller clamp circuit is configured to decrease a voltage level of the control terminal of the main device.

Another aspect of the present disclosure is a conversion circuit. The conversion circuit includes a main device, a voltage control switching circuit and a protection circuit. The main device includes a first terminal, a second terminal and a control terminal. The voltage control switching circuit includes a first terminal, a second terminal and a reference terminal. The first terminal is configured to receive a first driving signal. The second terminal is coupled to the control terminal of the main device, and configured to transmit a second driving signal to drive the main device. The reference terminal is coupled to the second terminal of the main device. A voltage level of the second driving signal is generated by the voltage control switching circuit. The protection circuit is electrically coupled to the first terminal of the voltage control switching circuit and the reference terminal of the voltage control switching circuit, and configured to transmit an electrostatic voltage to the reference terminal of the voltage control switching circuit.

Another aspect of the present disclosure is a conversion circuitry. The conversion circuitry includes a first conversion circuit and a second conversion circuit. The first conversion circuit includes a first main device and a first voltage control switching circuit. The first main device includes a first terminal, a second terminal and a control terminal. The first voltage control switching circuit includes a first terminal, a second terminal and a reference terminal. The first terminal is configured to receive a first driving signal. The second terminal is coupled to the control terminal of the first main device, and configured to transmit a second driving signal to drive the first main device. The reference terminal is coupled to the second terminal of the first main device. A voltage level of the second driving signal is generated by the first voltage control switching circuit. The second conversion circuit serise connected to the first conversion circuit, and includes a second main device and a second voltage control switching circuit. The second main device includes a first terminal, a second terminal and a control terminal. The second voltage control switching circuit includes a first terminal, a second terminal and a second reference terminal. The first terminal is configured to receive the first driving signal. The second terminal is coupled to the control terminal of the second main device, and configured to transmit a third driving signal to drive the second main device. The second reference terminal is coupled to the second terminal of the second main device. A voltage level of the third driving signal is generated by the second voltage control switching circuit.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
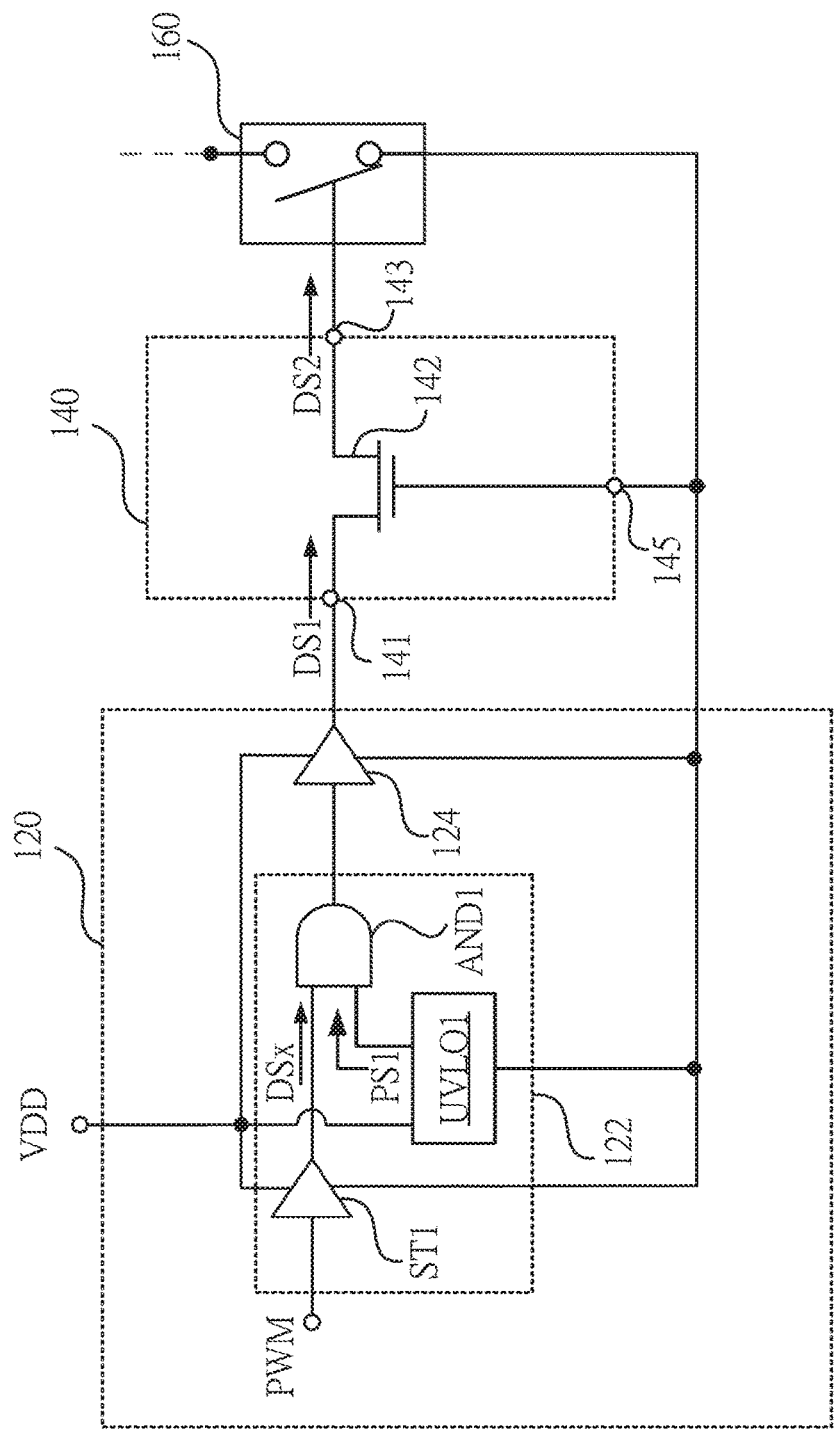
FIG. 1 is a diagram illustrating a conversion circuit according to some embodiments of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

In the following description and in the claims, the terms "include" and "comprise" are used in an open-ended fashion, and thus should be interpreted to mean "include, but not limited to." As used herein, the term "and/or" includes any and all combinations of one or more of the associated listed items.

In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Reference is made to FIG. 1. FIG. 1 is a diagram illustrating a conversion circuit 100 according to some embodiments of the present disclosure. As shown in FIG. 1, the conversion circuit 100 includes a driving signal generator 120, a voltage control switching circuit 140 and a main device 160. The driving signal generator 120 includes a logic circuit 122 and a driver buffer 124, and is configured to receive an input voltage VDD from a voltage source and generate a driving signal DS1.

Specifically, the input voltage VDD is provided to the logic circuit 122 and the driver buffer 124 to supply the required power. In some embodiments, the logic circuit 122 is configured to generate the driving signal DS1 according to a pulse-width modulation (PWM) signal PWM.

For example, as shown in FIG. 1, the logic circuit 122 may include a Schmitt trigger ST1, an Under-Voltage Lockout (UVLO) circuit UVLO1, and an AND gate AND1. The Schmitt trigger is ST1 configured to receive the pulse-width modulation (PWM) signal PWM, and output a signal DSx, in which the value of the signal DSx retains the value until the pulse-width modulation signal PWM at the input terminal changes sufficiently to trigger a change.

The Under-Voltage Lockout (UVLO) circuit UVLO1 is configured to monitor the input voltage VDD and provide a protection signal PS1 on the condition that under voltage occurs. The AND gate AND1 is coupled to the Schmitt trigger ST1, and the Under-Voltage Lockout (UVLO) circuit UVLO1 at the input side, and perform an AND operation correspondingly to output the driving signal DS1 in response to the received signals. The driving signal DS1 is transmitted to the driver buffer 124 coupled to the logic circuit 122, and the driver buffer 124 is configured to output the driving signal DS1 via an output terminal.

In structural, the voltage control switching circuit 140 includes a first terminal 141, a second terminal 143 and a reference terminal 145. As shown in FIG. 1, in some embodiments, the first terminal 141 is coupled to the output terminal of the driver buffer 124. The second terminal 143 is coupled to a control terminal of the main device 160. The reference terminal 145 is coupled to the reference terminal of the driver buffer 124 and a second terminal of the main device 160.

The voltage control switching circuit 140 is configured to receive the driving signal DS1 via the first terminal 141, and transmit a driving signal DS2 to drive the main device 160 via the second terminal 143. The current passing through the voltage control switching circuit 140 is controlled in response to a voltage level of the reference terminal 145. In addition, in some embodiments, the voltage control switching circuit 140 is normally-on in response to a zero gate-source voltage at the reference terminal 145.

For example, as shown in FIG. 1, in some embodiments, the voltage control switching circuit 140 may include a voltage-control switch 142. A drain terminal of the voltage-control switch 142 is coupled to the first terminal 141. A source terminal of the voltage-control switch 142 is coupled to the second terminal 143. A gate terminal of the voltage-control switch 142 is coupled to the reference terminal 145. The voltage-control switch 142 may include a depletion type metal-oxide-semiconductor field-effect transistor (MOSFET) switching device to achieve the normally-on operation in response to the zero gate-source voltage at the reference terminal 145, but the present disclosure is not limited thereto. In some other embodiments, the voltage-control switch 142 may include other suitable semiconductor devices having similar channel current to gate voltage characteristics to achieve the voltage-control switch 142. Alternatively stated, the voltage-control switch 142 may include a depletion type MOSFET switching device, an enhancement type MOSFET switching device, or any combination thereof.

Figure 2:
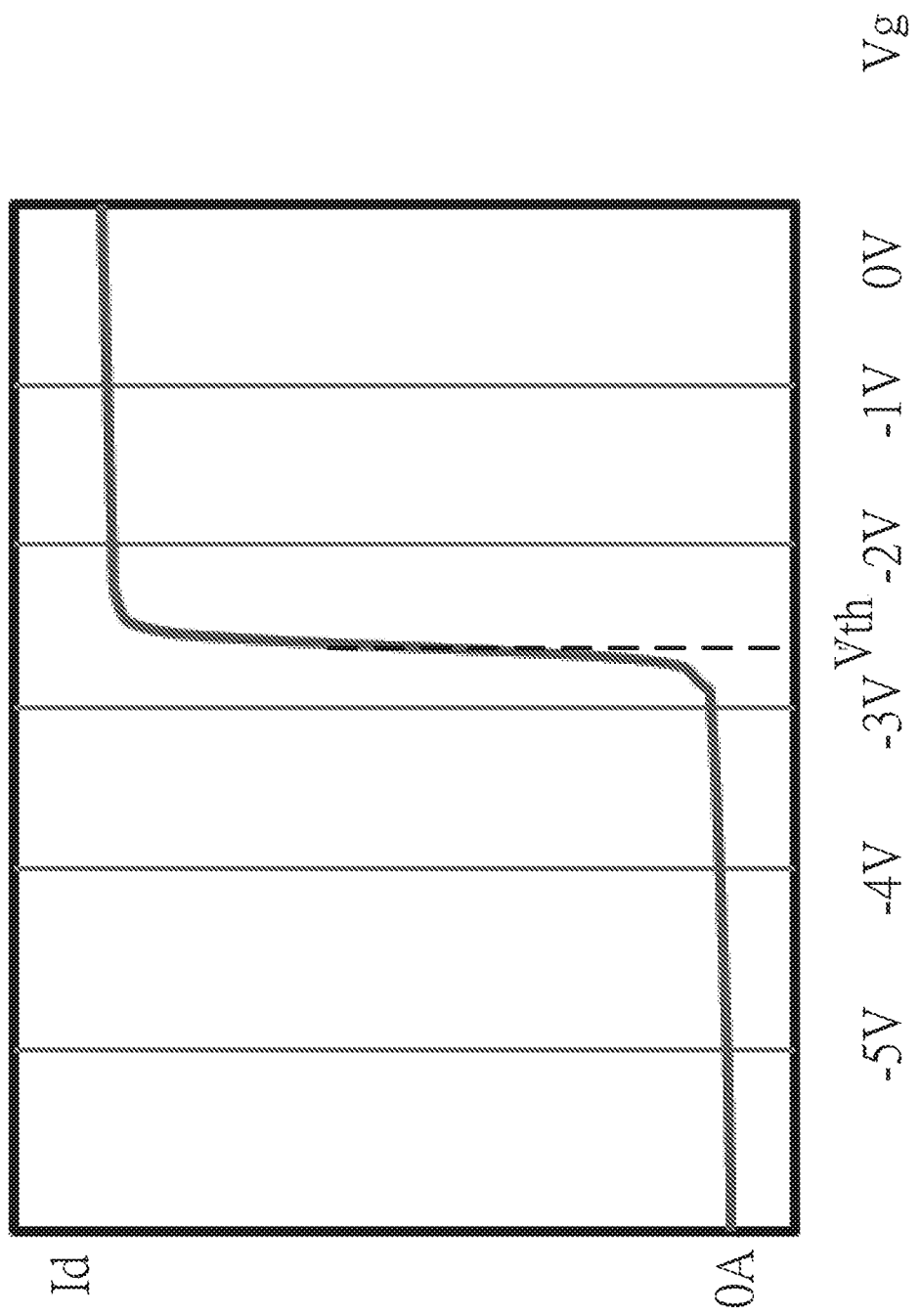
FIG. 2 is a diagram illustrating the characteristic curve of the channel current to the gate voltage of the voltage control switching circuit according to some embodiment of the present disclosure.

Reference is made to FIG. 2. FIG. 2 is a diagram illustrating the characteristic curve of the channel current (Id) to the gate voltage (Vg) of the voltage control switching circuit 140 according to some embodiment of the present disclosure.

As shown in FIG. 2, the voltage control switching circuit 140 is normally-on in response to the zero gate-source voltage at the reference terminal 145. The threshold voltage Vth of the voltage control switching circuit 140 is negative, and the voltage control switching circuit 140 is configured to be off on the condition that the gate-source voltage is smaller than the negative threshold voltage Vth. In some embodiments, the threshold voltage Vth is the threshold voltage of the MOSFET switching device. For example, in some embodiments, the threshold voltage of the normally-on device is between −0,1 volts and −20 volts.

Accordingly, the voltage level of the driving signal DS2 will be clamped by the voltage control switching circuit 140 in response to the threshold voltage Vth of the voltage control switching circuit 140 on the condition that the voltage level of the driving signal DS1 is higher than a specific value. Alternatively stated, the voltage level of the driving signal DS1 is higher than the voltage level of the driving signal DS2 since the voltage level of the driving signal DS2 is clamped by the voltage control switching circuit 140.

Therefore, in some embodiments, the driving signal generator 120 may receive the same input voltage VDD having a relative high level (e.g., 12V) directly from the voltage source, and correspondingly output the driving signal DS1 with a high level. Since the voltage level of the driving signal DS2 is clamped to be lower than using the voltage control switching circuit 140, the main device 160 is prevented from damages resulting from driving signals with voltage level greater than the upper safety limit. Thus, in some embodiments, no additional regulator is required in the driving signal generator 120 to lower the input voltage VDD received from the voltage source, and the driving signal generator 120 may apply the voltage source of the system directly. Furthermore, in some embodiments, the high voltage resulted from the electrostatic discharge (ESD) may also be isolated by the voltage control switching circuit 140 to protect the main device 160 from damaging.

Figure 3:
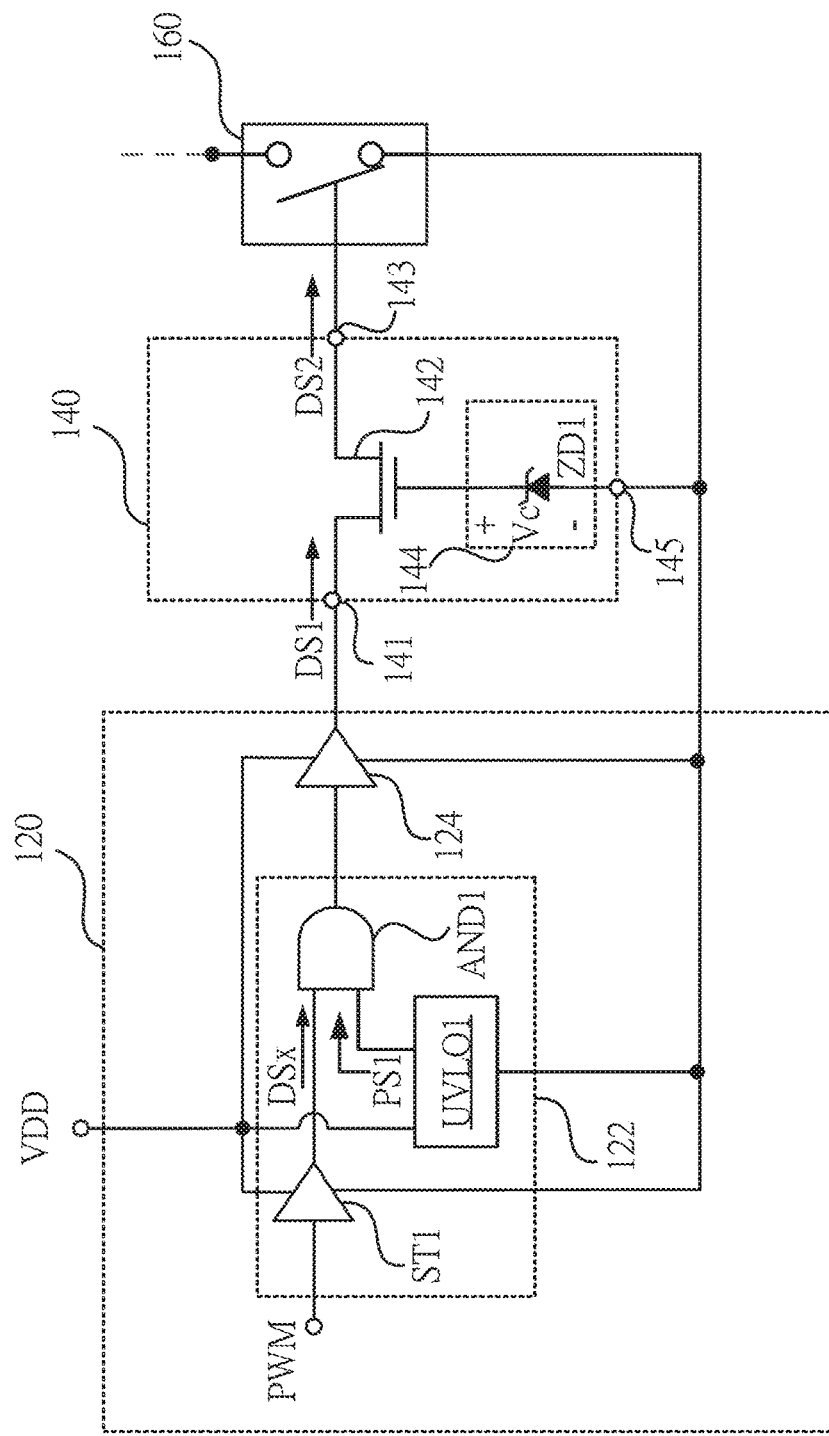
FIG. 3 is a diagram illustrating the conversion circuit according to some other embodiments of the present disclosure.

Reference is made to FIG. 3. FIG. 3 is a diagram illustrating the conversion circuit 100 according to some other embodiments of the present disclosure. With respect to the embodiments of FIG. 3, like elements in FIG. 1 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 3.

Compared to the embodiments shown in FIG. 2, in the conversion circuit 100 of FIG. 3, the voltage control switching circuit 140 further include a clamping circuit 144 electrically coupled between the gate terminal of the voltage-control switch 142 and the reference terminal 145 of the voltage control switching circuit 140. As shown in FIG. 3, in structural, the gate terminal of the voltage-control switch 142 is coupled to a first terminal of the clamping circuit 144, and a second terminal of the clamping circuit 144 is coupled to the reference terminal 145 of the voltage control switching circuit 140.

The clamping circuit 144 is configured to clamp a voltage Vc across the first terminal and the second terminal of the clamping circuit 144 to a predetermined level. For example, as shown in FIG. 3, in some embodiments, the clamping circuit 144 may include a Zener diode ZD1. Accordingly, the voltage Vc across the first terminal and the second terminal of the clamping circuit 144 is clamped to the predetermined level corresponding to the breakdown voltage of the Zener diode ZD1.

Since the voltage Vc is clamped to the predetermined level, the voltage-control switch 142 with a lower threshold voltage may be applied to adjust the voltage level of the driving signal DS2, such that the entire circuit can operate flexibly. In addition, the voltage-control switch 142 with the same threshold voltage may be applied to the main device 160 having higher rated voltage by introducing the clamping circuit 144 to provide the clamped voltage Vc. Accordingly, the clamped voltage Vc of the clamping circuit 144 is provided to increase the rated voltage of the main device 160. Alternatively stated, the voltage level of the driving signal DS2 can be adjusted based on the clamped voltage Vc, without exceeding the rated voltage of the main device 160.

Figure 4B:
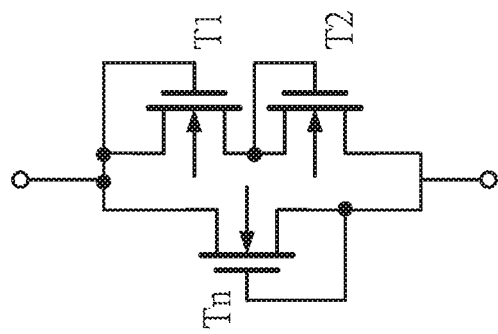
FIG. 4A and FIG. 4B are diagrams illustrating approaches to implement the clamping circuit according to some embodiments of the present disclosure.
Figure 4A:
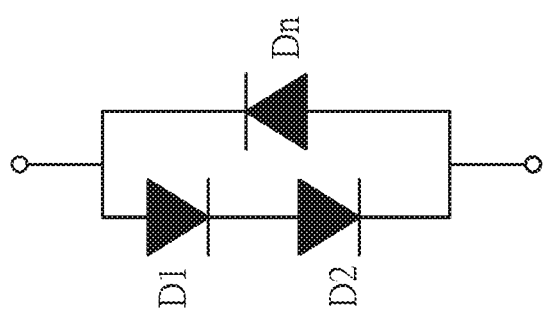

Reference is made to FIG. 4A and FIG. 4B together. FIG. 4A and FIG. 4B are diagrams illustrating other approaches to implement the clamping circuit 144 according to some embodiments of the present disclosure. As shown in FIG. 4A, in some alternative embodiments, the clamping circuit 144 may be realized by multiple diodes D1-Dn electrically coupled to each other. As shown in FIG. 4B, in some alternative embodiments, the clamping circuit 144 may be realized by multiple MOSFETs T1-Tn electrically coupled to each other. The gate terminal of one of the MOSFETs T1-Tn is electrically coupled to the source terminal or the drain terminal of another one of the MOSFETs T1-Tn. The number of the diodes D1-Dn or the MOSFETs T1-Tn may be adjusted according to actual needs and thus the present disclosure is not limited to examples shown in FIG. 4A and FIG. 4B.

Figure 5:
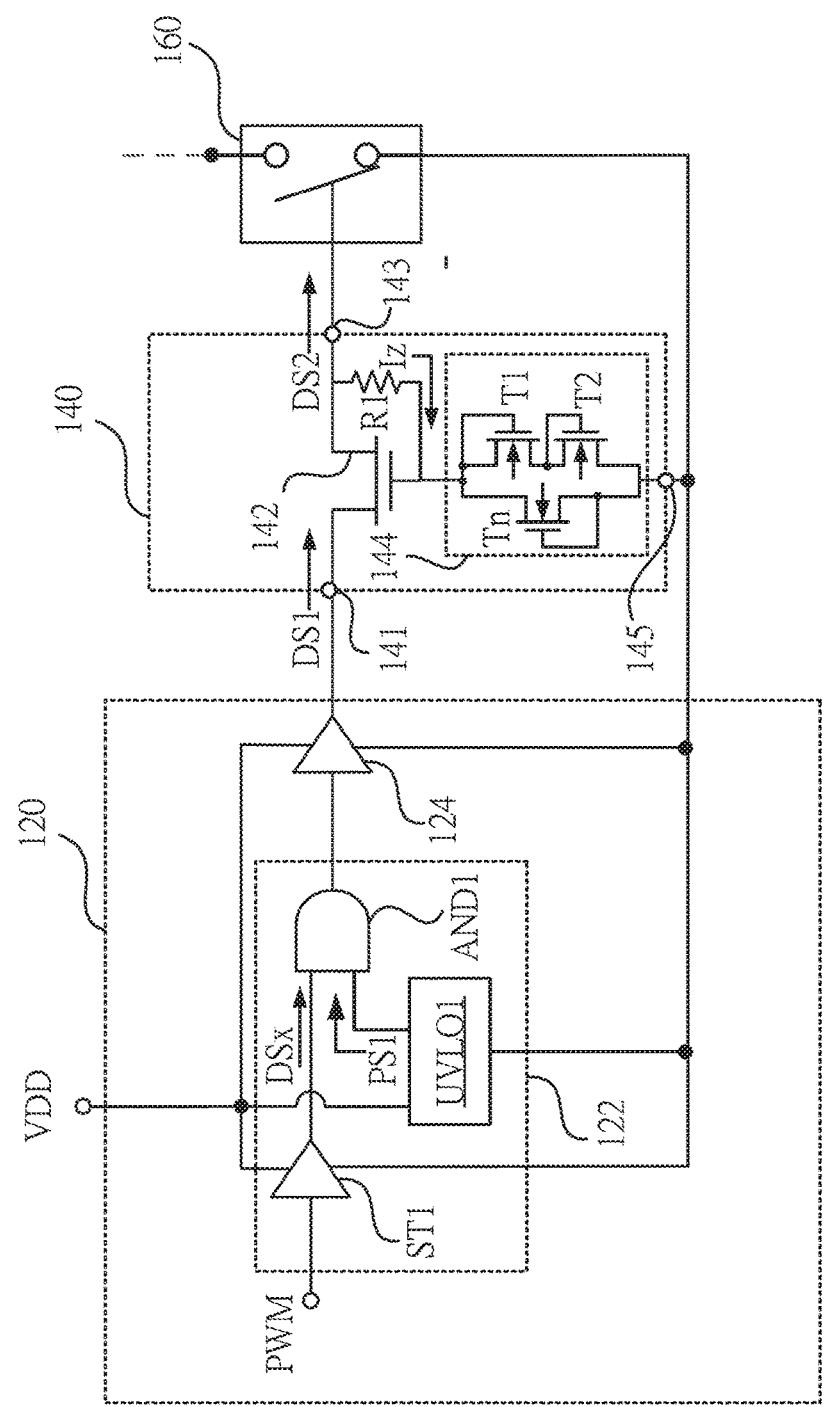
FIG. 5 is a diagram illustrating the conversion circuit according to some other embodiments of the present disclosure.

Reference is made to FIG. 5. FIG. 5 is a diagram illustrating the conversion circuit 100 according to some other embodiments of the present disclosure. With respect to the embodiments of FIG. 5, like elements in FIG. 1 and FIG. 3 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 1 and FIG. 3.

Compared to the embodiments shown in FIG. 3, in the conversion circuit 100 of FIG. 5, the voltage control switching circuit 140 further includes a resistor R1. The first terminal of the resistor R1 is coupled to the source terminal of the voltage-control switch 142, and the second terminal of the resistor R1 is coupled to the gate terminal of the voltage-control switch 142. In some embodiments, the resistor R1 may be realized by the on-resistance of the MOSFET. In some alternative embodiments, the resistor R1 may be the equivalent resistance of the gate-to-source leakage current of the voltage-control switch 142. The resistor R1 may provide a current path for the current Iz flowing through the clamping circuit 144 in order to protect the main device 160.

In various embodiments of the present disclosure, the main device 160 may be the power switching element applied in various switching power supply devices, such as a buck converter, a boost converter, a buck-boost converter or any other devices having power switches. For example, the main device 160 may include a Gallium Nitride (GaN) switching device, a MOSFET switching device, an Insulated Gate Bipolar Transistor (IGBT) switching device, a bipolar junction transistor (BJT) switching device, a Silicon Carbide (SiC) switching device, a relay switching device, or any combination thereof.

Reference is made to FIG. 6A-FIG. 6D. FIG. 6A-FIG. 6D are diagrams illustrating integration of the voltage control switching circuit 140 and the main device 160 according to some embodiments of the present disclosure.

Figure 6A:
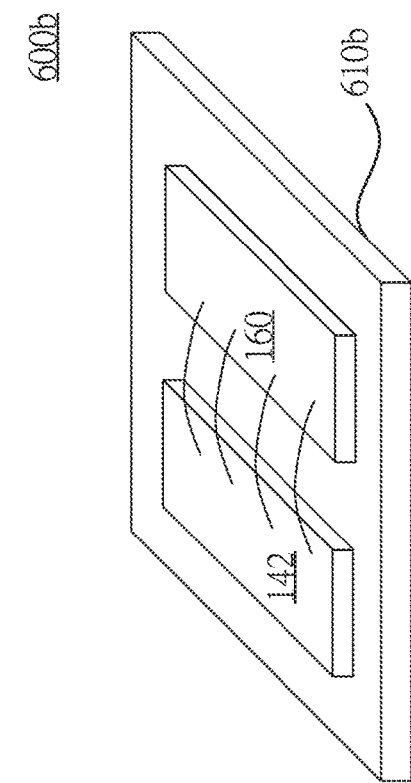
FIG. 6A-FIG. 6D are diagrams illustrating integration of the voltage control switching circuit and the main device according to some embodiments of the present disclosure.
Figure 6B:
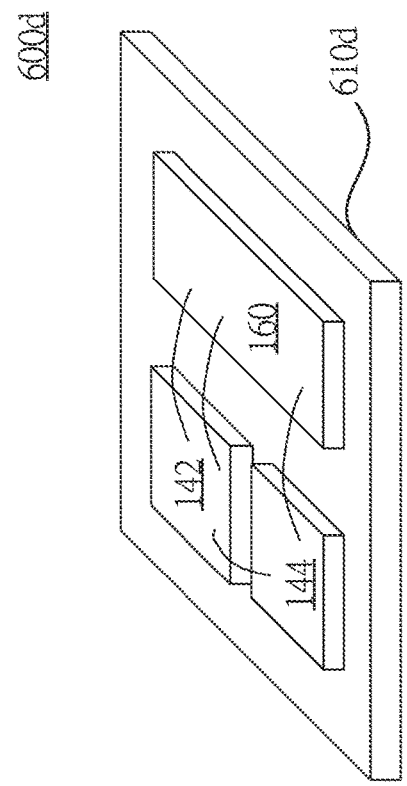

Corresponding to the embodiments shown in FIG. 1, as shown in FIG. 6A, in some embodiments, the normally-on voltage-control switch 142 and the main device 160 are integrated or packaged together with System on Chip (SoC) on a substrate 610a to form a chip 600a. As shown in FIG. 6B, in some embodiments, the normally-on voltage-control switch 142 and the main device 160 are integrated or packaged together with System in Package (SiP) on a substrate 610b to form a package 600b. In various embodiments, SiP dies may be stacked vertically or tiled horizontally and internally connected by wires that are bonded to the package.

Figure 6C:
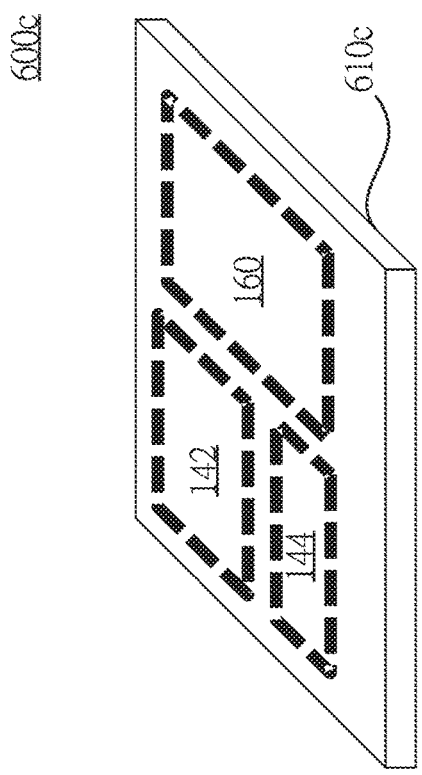
Figure 6D:
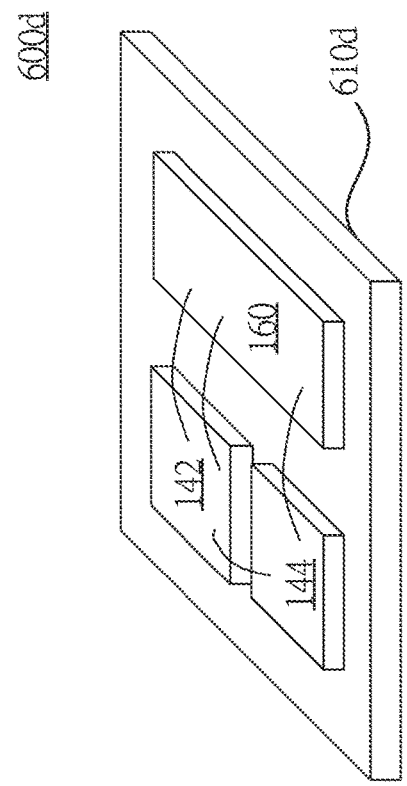

Corresponding to the embodiments shown in FIG. 3, as shown in FIG. 6C, in some embodiments, the normally-on voltage-control switch 142, the clamping circuit 144, and the main device 160 are integrated or packaged together with System on Chip (SoC) on a substrate 610c to form a chip 600c. As shown in FIG. 6D, in some embodiments, the normally-on voltage-control switch 142, the clamping circuit 144, and the main device 160 are integrated or packaged together with System in Package (SiP) on a substrate 610d to form a package 600d.

In other words, in various embodiments, the voltage control switching circuit 140 and the main device 160 may be integrated or packaged together with System in Package, System on Chip, three-dimensional integrated circuit (3D IC), etc.

Figure 7B:
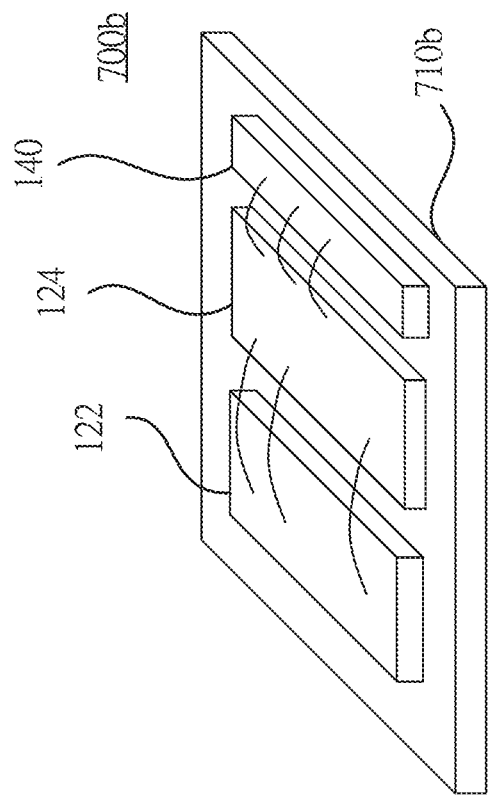
FIG. 7A and FIG. 7B are diagrams illustrating integration of the driving signal generator and the voltage control switching circuit according to some embodiments of the present disclosure.
Figure 7A:
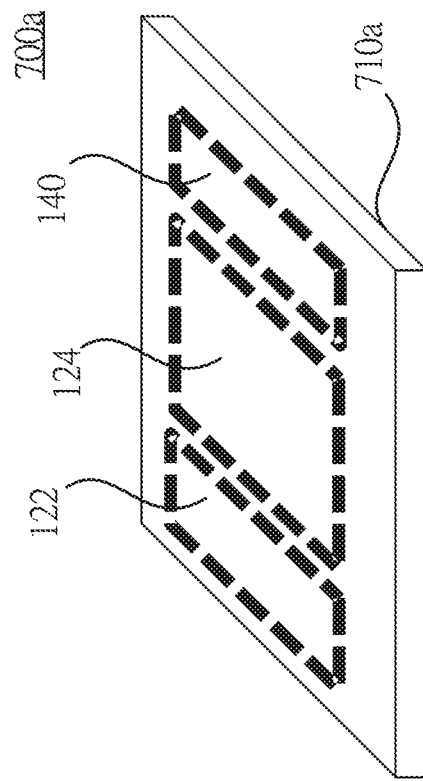

Reference is made to FIG. 7A and FIG. 7B. FIG. 7A and FIG. 7B are diagrams illustrating integration of the driving signal generator 120 and the voltage control switching circuit 140 according to some embodiments of the present disclosure.

Corresponding to the embodiments shown in FIG. 1, as shown in FIG. 7A, in some embodiments, the logic circuit 122, the driver buffer 124, and the voltage control switching circuit 140 are integrated or packaged together with System on Chip (SoC) on a substrate 710a to form a chip 700a. As shown in FIG. 7B, in some embodiments, the logic circuit 122, the driver buffer 124, and the voltage control switching circuit 140 are integrated or packaged together with System in Package (SiP) on a substrate 710b to form a package 700b.

In other words, in various embodiments, similar to the integration applied to the voltage control switching circuit 140 and the main device 160, in some embodiments, the driving signal generator 120 and the voltage control switching circuit 140 may be integrated or packaged together with System in Package, System on Chip, 3D IC, etc.

In some other embodiments, the driving signal generator 120, the voltage control switching circuit 140 and the main device 160 may also be integrated or packaged together with System in Package, System on Chip, 3D IC, etc, and further explanation is omitted herein for the sake of brevity.

In addition, the elements in the above embodiments may be implemented by various digital or analog circuits, and may also be implemented by different integrated circuit chips. Each element may also be integrated in a single chip. It is noted that, in an actual implementation, the circuits may be realized by a microcontroller unit (MCU), or by be realized in various ways such as by a digital signal processor (DSP), a field-programmable gate array (FPGA), etc. The switches and transistors may be realized by proper devices. For example, the switches may be implemented by power semiconductor devices including but not limited to Insulated Gate Bipolar Transistors (IGBTs), bipolar junction transistors (BJTs), SiC metal-oxide-semiconductor field-effect transistors (MOSFET), or mechanical switches, such as various types of relays. The normally-on switching devices may be GaN transistors or semiconductors devices with similar I-V characteristics. Transformer, diodes, resistors, capacitor units and/or inductors units may be realized by suitable electronic elements. The above list is merely exemplary and is not meant to be limitations of the present disclosure.

In summary, in various embodiments of the present disclosure, by arranging the normally-on voltage control switching circuit 140 between the driving signal generator 120 and the main device 160, no extra regulation circuit is required and the driver may directly apply the system power to provide driving signals to the power semiconductors devices. Furthermore, the normally-on voltage control switching circuit 140 may protect the power semiconductors devices from the high voltage due to the electrostatic discharge.

Figure 8:
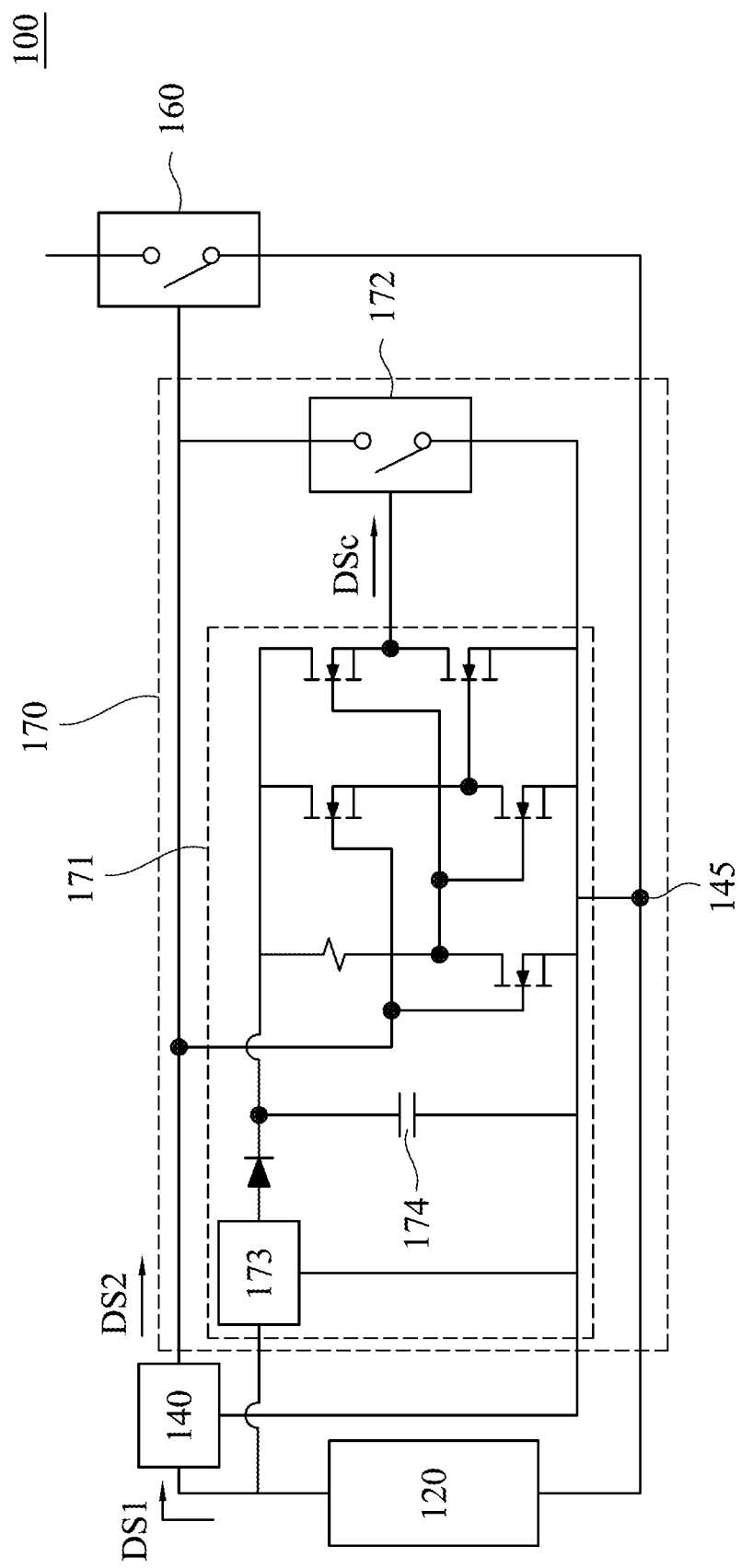
FIG. 8 is a diagram illustrating the conversion circuit according to some other embodiments of the present disclosure.

Reference is made to FIG. 8. FIG. 8 is a diagram illustrating the conversion circuit 100 according to some other embodiments of the present disclosure. With respect to the embodiments of FIG. 8, like elements in FIG. 1 are designated with the same reference numbers for ease of understanding. The specific operations of similar elements, which are already discussed in detail in the above paragraphs, are omitted herein for the sake of brevity, unless there is a need to introduce the co-operation relationship with the elements shown in FIG. 8.

As shown in FIG. 8, the conversion circuit 100 includes the driving signal generator 120, a voltage control switching circuit 140, the main device 160 and a miller clamp circuit 170. The miller clamp circuit 170 is electrically coupled to the control terminal of the main device 160 and the reference terminal 145 of the voltage control switching circuit 140. The miller clamp circuit 170 is configured to receive the second driving signal DS2. When the main device 160 is turned off, the miller clamp circuit 170 is configured to decrease a voltage level of the control terminal of the main device 160.

In some embodiments, the miller clamp circuit 170 includes an inverter circuit 171 and an integrate active switch 172. The inverter circuit 171 is configured to receive the second driving signal DS2, and output a control driving signal DSc. The integrate active switch 172 is electrically coupled to the control terminal of the main device 160 and the reference terminal 145 of the voltage control switching circuit 140. The integrate active switch 172 is configured to turn on according to the control driving signal DSc so that the control terminal of the main device 160 may conduct to the reference terminal 145 of the voltage control switching circuit 140.

For example, when the voltage level of the second driving signal DS2 is used to turn on the main device 160, the control driving signal DSc outputted by the inverter circuit 171 is used to turned off the integrate active switch 172. On the other hand, when the voltage level of the second driving signal DS2 is used to turn off the main device 160, the control driving signal DSc outputted by the inverter circuit 171 is used to turned on the integrate active switch 172. At this time, the voltage level of the control terminal of the main device 160 may decrease to the same as the voltage level of the reference terminal 145 of the voltage control switching circuit 140. Accordingly, when the main device 160 is turned off according to the second driving signal DS2, the miller clamp circuit 170 may confirm that the main device 160 maintains to the turn off state by decreasing the voltage level of the control terminal of the main device 160.

In some other embodiments, the inverter circuit 171 further includes a regulator 173 and a capacitance 174. The regulator 173 is electrically coupled to a capacitance 174. The inverter circuit 171 is configured to receive the first driving signal DS1. The regulator 173 and the capacitance 174 are configured to convert the signal DS1 into a working power supply to the inverter circuit 171.

In addition, the driving signal generator 120 and a voltage control switching circuit 140 shown in FIG. 8 can be implemented by the circuit embodiments shown in FIG. 1, 3-5.

Figure 9:
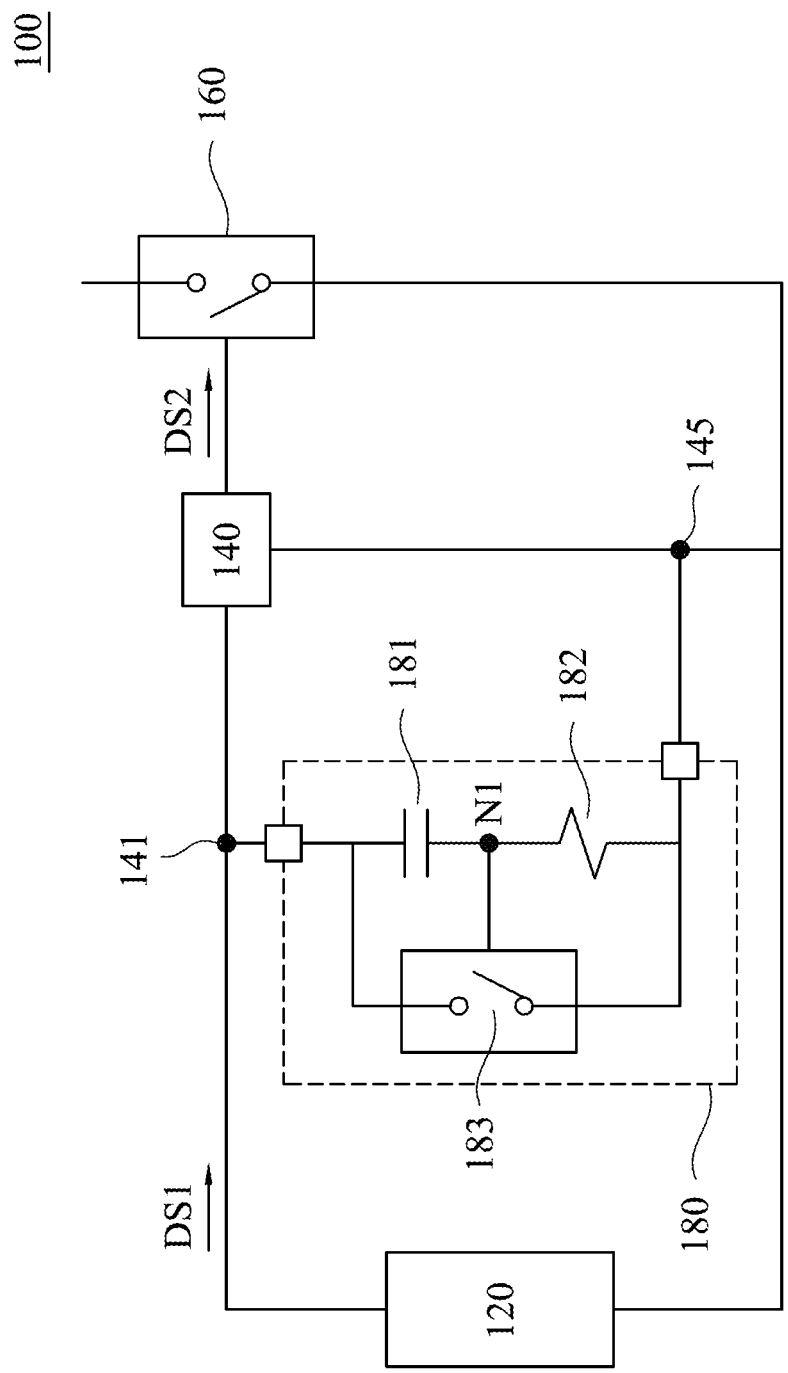
FIG. 9 is a diagram illustrating the conversion circuit according to some other embodiments of the present disclosure.

Reference is made to FIG. 9. FIG. 9 is a diagram illustrating the conversion circuit 100 according to some other embodiments of the present disclosure. With respect to the embodiments of FIG. 9, like elements in FIG. 1 are designated with the same reference numbers for ease of understanding. The specific operations of similar elements, which are already discussed in detail in the above paragraphs, are omitted herein for the sake of brevity, unless there is a need to introduce the co-operation relationship with the elements shown in FIG. 9.

As shown in FIG. 9, the conversion circuit 100 includes the driving signal generator 120, a voltage control switching circuit 140, the main device 160 and a protection circuit 180. The protection circuit 180 is electrically coupled to the first terminal 141 of the voltage control switching circuit 140 and the reference terminal 145 of the voltage control switching circuit 140. The protection circuit 180 is further configured to transmit an electrostatic voltage to the reference terminal 145 (e.g., ground terminal) of the voltage control switching circuit 140. Accordingly, when a high voltage resulted from the electrostatic discharge (ESD) occurs, the high voltage (i.e., electrostatic voltage) may conduct to the reference terminal 145 through the protection circuit 180 so as to protect the main device 160 from damaging.

In some other embodiments, the protection circuit 180 includes a detection capacitance 181, a detection resistor 182 and a protection switch unit 183. The detection capacitance 181 is electrically coupled to the first terminal 141 of the voltage control switching circuit 140 and a control node N1. The detection resistor 182 is electrically coupled to the control node N1 and the reference terminal 145 of the voltage control switching circuit 140. The detection switch unit 183 is electrically coupled to the first terminal 141 and the reference terminal 145 of the voltage control switching circuit 140. The protection switch unit 183 is configured to turn on according to a voltage level of the control node N1.

For example, when the voltage level of the first driving signal DS1 increases suddenly in a short time, the protection switch unit 183 may be turn on so that the first driving signal DS1 may short-circuit to the reference terminal 145. On the other hand, the position of the detection capacitance 181a nd the position of the detection resistor 182 can be exchanged. When the voltage level of the first driving signal DS1 decreases suddenly in a short time, the protection switch unit 183 may be turned on so that the first driving signal DS1 may short-circuit to the reference terminal 145.

Similarly, the driving signal generator 120 and a voltage control switching circuit 140 shown in FIG. 9 can be implemented by the circuit embodiments shown in FIGS. 1, 3-5.

Figure 10:
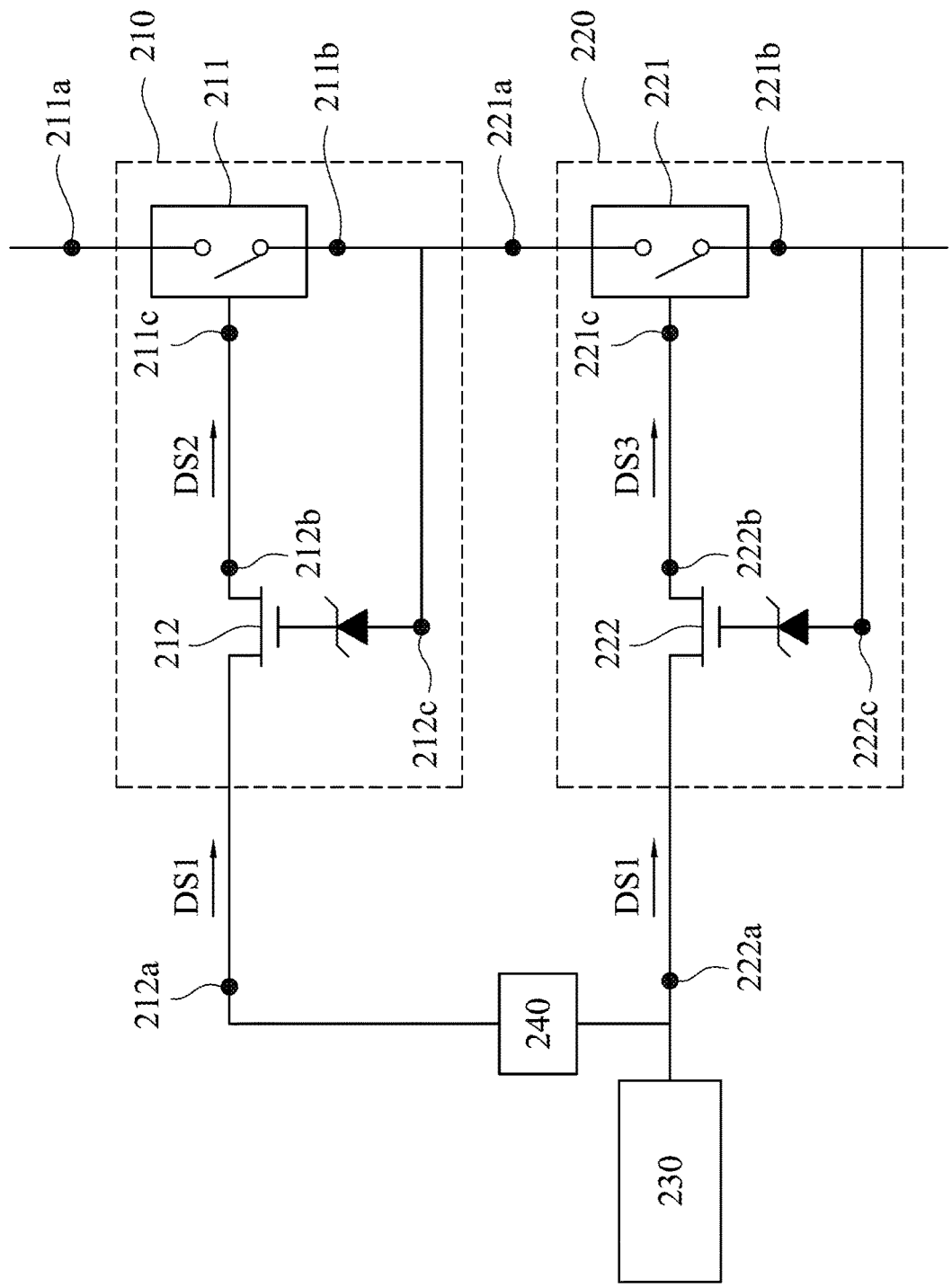
FIG. 10 is a diagram illustrating the conversion circuitry according to some other embodiments of the present disclosure.

Reference is made to FIG. 10. FIG. 10 is a diagram illustrating the conversion circuitry according to some other embodiments of the present disclosure. As shown in FIG. 8, the conversion circuitry 200 includes a first conversion circuit 210 and a second conversion circuit 220. The second conversion circuit 220 and the first conversion circuit 210 may apply the same circuit of the conversion circuit 100 in the foregoing embodiments. The second conversion circuit 220 series connected to the first conversion circuit 210 so that the first conversion circuit 210 and the second conversion circuit 220 have better pressure resistance.

In some embodiments, the first conversion circuit 210 includes a first main device 211 and a first voltage control switching circuit 212. The first main device 211 includes a first terminal 211a, a second terminal 211b and a control terminal 211c. The first voltage control switching circuit 212 includes a first terminal 212a, a second terminal 212b and a reference terminal 212c. The first terminal 212a is configured to receive the first driving signal DS1 from a driving signal generator 230 through a blocking circuit 240. The blocking circuit 240 is configured to let the first driving signal DS1 to pass, but prevent the reverse high voltage of the first driving signal DS1 from affecting the first conversion circuit 210. In some embodiments, the blocking circuit 240 may be implemented by a small capacitance or a level shifter, but not limit to this.

The second terminal 212b is coupled to the control terminal 211c of the first main device 211, and configured to transmit a second driving signal DS2 to drive the first main device 211. The reference terminal 212c is coupled to the second terminal 211b of the first main device 211. A voltage level of the second driving signal DS2 is generated by the first voltage control switching circuit 212.

The second conversion circuit 220 includes a second conversion circuit 221 and a second voltage control switching circuit 222. The second main device 221 includes a first terminal 221a, a second terminal 221b and a control terminal 221c. The second voltage control switching circuit 222 includes a first terminal 222a, a second terminal 222b and a second reference terminal 222c. The first terminal 222a is configured to receive the first driving signal DS1 from a driving signal generator 230. The second terminal 222b is coupled to the control terminal 221c of the second main device 221, and configured to transmit a third driving signal DS3 to drive the second main device 221. The second reference terminal 222c is coupled to the second terminal 221b of the second main device 221. A voltage level of the third driving signal DS3 is generated by the second voltage control switching circuit 222.

In some other embodiments, the first conversion circuit 210 and the second conversion circuit 220 are integrated or packaged together with system in package, system on chip, or 3D IC. In addition, the driving signal generator 230, the first voltage control switching circuit 211 and the second voltage control switching circuit 221 shown in FIG. 10 can be implemented by the circuit embodiments shown in FIGS. 1, 3-5.

It is noted that, the drawings, the embodiments, and the features and circuits in the various embodiments may be combined with each other as long as no contradiction appears. The circuits illustrated in the drawings are merely examples and simplified for the simplicity and the ease of understanding, but not meant to limit the present disclosure.

Although the disclosure has been described in considerable detail with reference to certain embodiments thereof, it will be understood that the embodiments are not intended to limit the disclosure. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A conversion circuitry, comprising:
   a first conversion circuit, comprising:
   a first main device, comprising a first terminal, a second terminal and a control terminal;
   a first voltage control switching circuit, comprising:
   a first terminal configured to receive a first driving signal;
   a second terminal coupled to the control terminal of the first main device, and configured to transmit a second driving signal to drive the first main device; and
   a reference terminal coupled to the second terminal of the first main device, wherein a voltage level of the second driving signal is generated by the first voltage control switching circuit; and
   a second conversion circuit series connected to the first conversion circuit, comprising:
   a second main device, comprising a first terminal, a second terminal and a control terminal;
   a second voltage control switching circuit, comprising:
   a first terminal configured to receive the first driving signal;
   a second terminal coupled to the control terminal of the second main device, and configured to transmit a third driving signal to drive the second main device, wherein the first main device is turned on according to the second driving signal when the second main device is turned on; and
   a second reference terminal coupled to the second terminal of the second main device, wherein a voltage level of the third driving signal is generated by the second voltage control switching circuit.

2. The conversion circuitry of claim 1, wherein the first conversion circuit and the second conversion circuit are integrated or packaged together with system in package, system on chip, or 3D IC.

3. The conversion circuitry of claim 1, wherein the voltage level of the second driving signal is generated by the first voltage control switching circuit in response to a reference voltage of the first voltage control switching circuit.

4. The conversion circuitry of claim 3, wherein the first voltage control switching circuit comprises:
   a voltage-control switch comprising:
   a drain terminal coupled to the first terminal of the first voltage control switching circuit;
   a source terminal coupled to the second terminal of the first voltage control switching circuit; and
   a gate terminal coupled to the reference terminal of the first voltage control switching circuit.

* * * * *